United States Patent [19]

Shinozaki et al.

[11] Patent Number: 5,158,857
[45] Date of Patent: Oct. 27, 1992

[54] IMAGE FORMING MATERIAL

[75] Inventors: Fumiaki Shinozaki, Shizuoka; Tomohisa Tago, Tokyo; Tomizo Namiki; Hideyuki Nakamura, both of Shizuoka, all of Japan

[73] Assignee: Fuji Photo Film Co., Ltd., Kanagawa, Japan

[21] Appl. No.: 596,662

[22] Filed: Oct. 11, 1990

[30] Foreign Application Priority Data

Oct. 11, 1989 [JP] Japan ................................. 1-264781

[51] Int. Cl.$^5$ .................... G03C 1/90; G03C 1/68; G03C 11/12
[52] U.S. Cl. .................... 430/262; 430/159; 430/162; 430/164; 430/166; 430/252; 430/260; 430/263
[58] Field of Search ............... 430/166, 262, 143, 292, 430/259, 160, 159, 162, 164, 252, 260, 263

[56] References Cited

U.S. PATENT DOCUMENTS

| 4,482,625 | 11/1984 | Namiki et al. | 430/260 |
| 4,766,053 | 8/1988 | Shinozaki et al. | 430/262 X |
| 5,085,969 | 2/1992 | Namiki et al. | 430/263 X |

FOREIGN PATENT DOCUMENTS

| A1-3604942 | 8/1986 | Fed. Rep. of Germany | 430/262 |
| 0793894 | 4/1958 | United Kingdom | 430/262 |

Primary Examiner—Cynthia Hamilton
Attorney, Agent, or Firm—Sughrue, Mion, Zinn, Macpeak & Seas

[57] ABSTRACT

A light-sensitive transfer sheet is disclosed, which comprises a support having provided thereon a peeling layer comprising an alcohol-soluble polyamide, an alkali-soluble organic polymer and a basic compound, and a color material-incorporated light-sensitive resin layer or a color material layer and a light-sensitive resin layer, in that order.

10 Claims, No Drawings

IMAGE FORMING MATERIAL

FIELD OF THE INVENTION

This invention relates to light-sensitive transfer sheets to be used for preparing a pre-press proof for color proofing, display and so on.

BACKGROUND OF THE INVENTION

In making color proof (or pre-press proof) utilizing photopolymers, two methods have so far been employed, i.e., the overlay method and the surprint method. The overlay method comprises the preparation of two or more color proofing sheets wherein each has a transparent support upon which is a separation image with one of the colors necessary for full color reproduction. Those sheets are superposed upon one another (the thus superposed sheet sandwich is called a color test sheet) to undergo color proofing. According to this method, a multicolor image can be formed in every color proofing procedure by superposing color proofing sheets with two to four different colors upon one another. Therefore, the method is advantageous in that it is convenient and can be used for continuous inspection.

On the other hand, the surprint method consists of forming separation images with individual colors one after another on one support to produce therefrom a multicolor image. A problem of the overlay method, namely the color reproduced by superposing color proofing sheets is more or less attended with distortion, is avoided by the surprint method so image quality more similar to the original is obtained in the graphic arts.

The surprint method can be accomplished in two ways, by color material-incorporation or by color material-supply. The color material-incorporation variation has as a merit in that the color density stability of said color proofing sheet is especially excellent because the color proofing sheet contains color material layers that are colored in advance, in contrast with that of color material-supplied variation in which color density of a color test sheet varies among manufacturers. Details of the production of color proofing sheets according to surprint methods are described, e.g., in JP-A-59-97140 (corresponding to U.S. Pat. No. 4,482,625), JP-A-61-188537, JP-A-63-2038, JP-A-63-2039 and so on (The term "JP-A" as used herein means an "unexamined published Japanese patent application").

A color proofing sheet described in detail in the above-cited patent specifications is a light-sensitive laminate, in which a peeling layer comprising organic polymers, a color material layer and a light-sensitive layer are laminated on a support, in that order, to form a light-sensitive material.

It is required of a peeling layer in such a light-sensitive transfer sheet as described above that in undergoing thermal transfer, the peeling layer can be peeled from the temporary support in a good condition, and that adhesiveness among nonimage parts of individual colors (peeling layers) and to each image part are sufficient.

To answer the above-described requirement, it is particularly desirable that alcohol-soluble polyamides such as copolymerized nylon, N-alkoxyalkyl-substituted nylon and the like be used. However, in the independent use of an alcohol-soluble polyamide the facility in peeling from the support tends to undergo the influence of humidity and, under high humidity in particular, poor transfer sometimes occurs because of increased adhesiveness to the support.

To solve this problem, it is desired that an alcohol-soluble nylon be used in combination with an alkali-soluble organic polymer, such as styrene-maleic acid copolymer, polyhydroxystyrene or the like, as disclosed in JP-A-61-188537, JP-A-63-2039 and so on. Even in the color proofing sheet prepared in accordance with the methods described therein, it sometimes happens that the peeling layer deteriorates with the lapse of time to cause poor transfer thereby resulting in deterioration of image quality.

SUMMARY OF THE INVENTION

An object of this invention is to provide a light-sensitive transfer sheet containing a peeling layer which does not undergo deterioration with the lapse of time.

The above-described object is attained with a light-sensitive transfer sheet, which comprises a support, provided thereon a peeling layer comprising an alcohol-soluble polyamide, an alkali-soluble organic polymer and a basic compound, and a color material-incorporated light-sensitive resin layer or a color material layer and a light-sensitive resin layer, in that order. That is, the use of the foregoing mixture as a material for the peeling layer enables the production of a light-sensitive transfer sheet having on a support, a peeling layer with excellent peeling facility and adhesiveness upon transfer. Thus, said transfer sheet does not undergo deterioration with the lapse of time and enables the formation of a transferred image of high quality upon transfer onto an image-receiving sheet.

DETAILED DESCRIPTION OF THE INVENTION

The light-sensitive transfer sheet of this invention has such a structure that a support is provided in a substantial sense with a peeling layer and a light-sensitive resin layer, in that order. In addition, an interlayer may be provided between those layers, and a releasing layer and a subbing layer may be provided on the support. The light-sensitive transfer sheet can be prepared, e.g., in the following manner.

As a material for the support, those which are stable chemically and thermally, and have flexibility are preferred. In addition, such materials may have a property of transmitting actinic rays, if desired. For instance, various kinds of materials are disclosed, e.g., in JP-A-47-41830, JP-A-48-9337, JP-A-51-5101 and so on, and examples include cellulose acetate, polyvinyl chloride, polystyrene, polypropylene and the like. In particular, polyethylene terephthalate, polycarbonate and heat-treatment products of these materials are preferred.

The thickness of the support may be from 20 to 300 $\mu$m, preferably from 75 to 150 $\mu$m.

For the purposes of improvement in workability and slippability, and prevention of halation, the support may be provided with a backing layer, which comprises a high molecular substance such as polyvinyl butyral, vinylchloride copolymers, vinyl acetate copolymers, cellulose acetate, etc., on the surface opposite to the side on which the peeling layer is present. Also, the backing layer may further contain various additives such as a matting agent, an antihalation agent and so on.

The support is provided with a peeling layer comprising organic polymers. The peeling layer, which is the characteristic requisite of this invention, is a layer comprising a mixture of an alcohol-soluble polyamide with an alkali-soluble organic polymer, and a basic compound.

Examples of alcohol-soluble polyamides include linear polyamides and N-alkoxyalkyl-substituted nylons which can be prepared from dibasic fatty acids, diamines, ω-amino acids, lactams or derivatives thereof in accordance with known methods, as described in JP-A-61-188537, JP-A-63-2039 and so on.

The alkali-soluble organic polymers are those containing a carboxyl group, a phenyl group, a sulfonic acid group, a sulfhydryl group or like groups, preferably carboxyl group, in a molecule. The polymers may contain one or more of a functional group selected from the foregoing list. In addition, copolymers of constituent monomers of the foregoing alkali-soluble organic polymers and styrene compounds (e.g., styrene-fumaric acid diester copolymers, styrene-acrylic acid copolymers) and copolymers containing a hydroxystyrene skeleton in repeating units can be employed to great advantage. Also, such alkali-soluble organic polymers as described above can further contain repeating units of vinyl compounds in the molecule thereof. Suitable examples of such vinyl compounds include vinyltoluene, halogenated styrenes, vinylethylbenzene, methoxystyrene, vinylheterocyclic compounds such as N-vinylcarbazole, vinylpyridine, vinyloxazole, vinylpyrrolidone, etc., and vinylcycloalkanes such as vinylcyclohexane, etc.

Improvements in adhesiveness, slippability and so on can be fulfilled by choosing properly the ratio of the alkali-soluble organic polymer and alcohol-soluble material.

A basic compound to be contained in the peeling layer is preferably one which has an acid dissociation constant (a pKa value) of 7 or higher. In general, the use of a basic compound with a high pKa value can prevent the alcohol-soluble polyamide in the peeling layer from suffering deterioration, while the use of a compound of a low pKa value, such as an acidic compound, results in stimulation of deterioration of the alcohol-soluble polyamide.

It is desirable that said basic compound have a structure represented by formula (I):

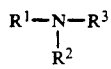

$$R^1-N-R^3 \atop R^2 \qquad (I)$$

wherein $R^1$, $R^2$ and $R^3$, which may be the same or different, each represents a hydrogen atom, a halogen atom, an alkyl group, an aralkyl group, an aryl group, an alkenyl group, an alkinyl group, a hydroxyl group or an alcoholic hydroxyl group. The groups for $R^1$, $R^2$ or $R^3$ may preferably contain from 1 to 12 carbon atoms, more preferably from 1 to 9 carbon atoms. Preferred examples of the groups include methyl group, ethyl group, isopropyl group, 2-hydroxyethyl group, cyclohexyl group, 2-butyl group, phenyl group, 3-carboxyphenyl group and tolyl group. As examples of such compounds, mention may be made of aromatic amine compounds such as substituted anilines and the like, substituted aliphatic amines such as ethylamine, diethylamine, triethylamine and the like and hydroxyl group-containing amine compounds such as 2-aminoethanol, diethanolamine, triethanolamine and the like. Among the above-cited basic compounds, those preferred over others are aliphatic amine compounds, especially diethanol amine, triethanolamine and diethylamine. In incorporating such basic compounds into the peeling layer, they may be used individually or as a mixture of two or more thereof.

Moreover, the combined use of the above-described basic compounds and hygroscopic compounds in the peeling layer is particularly advantageous. As such the hygroscopic compound, those containing a hydroxyl group or an alcoholic substituent are preferred. Specific examples thereof include ethylene glycol, diethylene glycol, polyethylene glycol and the like.

It is desired that the basic compounds be added in a proportion of from 0.01 to 10% by weight, preferably from 0.01 to 3% by weight, more preferably from 0.1 to 0.3% by weight, based on solid components in the peeling layer. Proportions increased beyond 10 % by weight are undesirable as the surface of the peeling layer becomes sticky.

The peeling layer of this invention can be formed in such a manner that the above-described alcohol-soluble polyamide, alkali-soluble organic polymer and basic compound are dissolved in a proper solvent to prepare a coating composition, and the coating composition thus prepared is applied to a support and dried. To the coating composition can be added various surface active agents for improvements in surface condition. In particular, fluorine-containing surface active agents are effective for the improvement. A thickness of the peeling layer ranges generally from 0.1 to 2.0 μm, and preferably from 0.3 to 1.0 μm.

On the peeling layer, as disclosed in JP-A-61-188537, JP-A-63-2039, JP-A-63-2040 and so on, a color material-incorporated light-sensitive resin layer may be provided directly; or a color material layer and a light-sensitive resin layer may be provided directly, in that order; or the combination of a color material layer and a light-sensitive resin layer, or a color material-containing light-sensitive resin layer may be provided via an interlayer. Details of the interlayer, color material layer and light-sensitive resin layer, and details of image formation utilizing these layers are described in the above-cited publications.

As for the constitution of the light-sensitive resin layer, all of those used in known light-sensitive transfer sheets are usable, but alkali developable light-sensitive resins are favored. Suitable examples of materials for the negative-positive (N-P) type light-sensitive resin layer include a composition blended of an azide type sensitizer such as 2,6-di(4'-azidobenzal)cyclohexane or the like, and a phenol novolak resin; and a composition blended of a benzylmethacrylate-methacrylic acid copolymer as a binder, a polyfunctional monomer such as trimethylolpropane triacrylate or the like, and a photopolymerization initiator such as Michler's ketone or the like.

On the other hand, examples for the positive-positive (P-P) type light-sensitive resin layer include compositions comprising a sensitizer of quinonediazide type, such as o-quinonediazide or the like. More specifically, quinonediaide type sensitizers including condensates prepared from 1,2-benzoquinonediazide-4-sulfonylchloride, 1,2-naphthoquinonediazide-4-sulfonylchloride, 1,2-naphthoquinonediazide-5-sulfonylchloride or 1,2-naphthoquinonediazide-6-sulfonylchloride, and hydroxyl and/or amino group-containing compounds can be effectively used therein.

As examples of hydroxyl group-containing compounds which can be used, mention may be made of trihydroxybenzophenone, dihydroxyanthraquinone, bisphenol A, phenol novolak resins, resorcinol-benzaldehyde condensation resins, pyrogallol-acetone condensation resins and so on. As examples of amino group-containing compounds which can be used, mention may be made of aniline, p-aminobenzophenone, p-aminodiphenylamine, 4,4,-diaminobenzophenone, 4,4,-diaminodiphenylamine and so on. Concerning the quinonediazide compounds including those cited above, J. Kosar, *Light Sensitive System*, John Wiley & Sons Co., New York (1965), and Nagamatsu and Inui, *Kankosei Kobunshi* (Photopolymers), Kodansha, Tokyo (1977) can be referred to. In addition, light-sensitive resin compositions which can be used as P-P type include those comprising (1) a compound capable of producing an acid by irradiation with active rays, (2) a compound containing at least one bond which can be cleaved by an acid and (3) a novolak resin containing two or three different kinds of phenols.

A thickness of the light-sensitive resin layer ranges generally from 0.5 to 10 μm, preferably from 1.0 to 5 μm.

In using a colored substance, the substance may be incorporated into the light-sensitive resin layer, or a color material layer provided separately from the light-sensitive layer. Though the color material layer can be provided on either side of the light-sensitive resin layer, it is advantageous to provide the color material layer on the upside, that is distal from the support, of the light-sensitive resin layer from the viewpoint of sensitivity of the light-sensitive resin layer in the step of imagewise exposure.

As for the colored substance, known pigments and dyes can be used. However, it is desirable for color proofing in the graphic arts that pigments of hues equal to those of color inks (including yellow, magenta, cyan and black pigments) be used. Details of the colored substance and the color material layer are disclosed, e.g., in JP-A-59-97140.

The thus prepared light-sensitive transfer sheet of this invention can be used for color proofing by undergoing processing in accordance with the surprint method as disclosed in the above-cited publication. Moreover, the thus prepared color proofing sheets have a characteristic that they can also be used for color proofing which conforms to the overlay method by being superposed directly and exactly on one another as they are.

This invention will now be illustrated in greater detail by reference to the following examples. However, the invention should not be construed as being limited to the examples.

EXAMPLE 1

Preparation of Light-sensitive Transfer Sheet (1)

A solution having the following composition was prepared as a coating solution for forming a peeling layer.

| | |
|---|---|
| Alcohol-soluble polyamide (CM-8000, trade name, produced by Toray Industries, Inc., [η] = 23 cps (20° C.), 10% by weight methanol solution) | 7.2 g |
| Styrene-maleic acid copolymer (Oxyrack SH-101, trade name, produced by Nippon Shokubai Kogaku Kogyo Co., Ltd.) | 1.8 g |
| Methanol | 400 g |
| Ethylene glycol monomethyl ether | 100 g |
| Triethanolamine (pKa = 7.76) | 0.5 g |

The prepared solution was coated uniformly on a 100 μm-thick polyethylene terephthalate film (temporary support), and dried to form a peeling layer with a dry thickness of 0.5 μm.

Then, a solution having the following composition was prepared as a coating solution for forming an interlayer.

| | |
|---|---|
| Polymethylmethacrylate (mean molecular weight: 100,000) | 3 g |
| Methyl ethyl ketone | 80 g |
| Ethylene glycol monomethyl ether acetate | 20 g |

The prepared solution was coated uniformly on the foregoing peeling layer, and dried to form an interlayer with a thickness of 0.5 μm.

Further, color material dispersions were prepared in accordance with the following formulae, respectively, for forming color material layers.

| | |
|---|---|
| Mother Liquor A: | |
| Styrene-maleic acid copolymer | 20 g |
| Methyl ethyl ketone | 80 g |
| Coating Solution for Forming Yellow Color Material Layer: | |
| Mother liquor A | 110 g |
| Methyl ethyl ketone | 40 g |
| Ethylene glycol monomethyl ether acetate | 25 g |
| Seika Fast Yellow H-0755 (trade name, produced by Dai-Nippon Seika Co., Ltd.) | 24.4 g |
| Coating Solution for Forming Magenta Color Material Layer: | |
| Mother liquor A | 110 g |
| Methyl ethyl ketone | 40 g |
| Ethylene glycol monomethyl ether acetate | 25 g |
| Seika Fast Carmine 1483 (trade name, produced by Dai-Nippon Seika Co., Ltd.) | 12.2 g |
| Coating Solution for Forming Cyan Color Material Layer: | |
| Mother liquor A | 110 g |
| Methyl ethyl ketone | 40 g |
| Ethylene glycol monomethyl ether acetate | 25 g |
| Cyanine Blue 4920 (trade name, produced by Dai-Nippon Seika Co., Ltd.) | 12.2 g |
| Coating Solution for Forming Black Color Material Layer: | |
| Mother liquor A | 110 g |
| Methyl ethyl ketone | 40 g |
| Ethylene glycol monomethyl ether acetate | 25 g |
| Mitsubishi Carbon Black MA-100 (trade name, produced by Mitsubishi Chemical Industries, Ltd.) | 12.2 g |

It took 3 hours to prepare each dispersion by means of a dispersing machine for test use (pain shaker, produced by Toyo Seiki Co., Ltd.).

In addition, a diluent for the foregoing pigment dispersions was prepared in accordance with the following forumla:

| | |
|---|---|
| Methyl ethyl ketone | 550 g |
| Ethylene glycol monomethyl ether acetate | 130 g |
| Fluorine-contained surface active agent (Florade FC-430, trade name, produced | 2 g | by Sumitomo 3M Co., Ltd.)

After the four pigment dispersions differing in color were diluted with the above-described diluent in their respective ratios (by weight) set forth below, the dispersions were subjected to stirring and ultrasonic dispersion each for 10 minutes to obtain coating solutions for their corresponding color material layers.

The thus obtained coating solutions were each filtered through filter paper, Toyo Roshi No. 63, coated using a whirler on the four separate peeling layers provided on their respective temporary supports, and dried at 100° C. for 2 minutes to form four differently colored color material
Yellow Layer:
Pigment dispersion/diluent ratio: 3.5/46.5
Thickness: 1.0 μm
Optical density (through blue filter): 0.5
Magenta Layer:
Pigment dispersion/diluent ratio: 4/46
Thickness: 0.7 μm
Optical density (through green filter): 0.75
Cyan Layer:
Pigment dispersion/diluent ratio: 4/46
Thickness: 0.8 μm
Optical density (through red filter): 0.65
Black Layer:
Pigment dispersion/diluent ratio: 5.5/44.5
Thickness: 0.7 μm
Optical density (without filter): 0.90

On each of the four color material layers, a positively working light-sensitive solution constituted by the following ingredients was coated by means of a whirler after filtration through the foregoing filter No. 63, and then dried at 100° C. for 2 minutes to form a light-sensitive layer having a thickness of 1 μm.

| | |
|---|---|
| 1,2-Naphthoquinone-(2)-diazido-5-sulfonic acid cumylphenol ester | 1.36 g |
| Novolak type phenol-formaldehyde resin (PR-50716, trade name, produced by Sumitomo Dures Co., Ltd.) | 2.86 g |
| Abietic acid | 0.32 g |
| Fluorine-contained surface active agent (Megafac F-104, trade name, produced by DaiNippon Ink & Chemicals, Inc.) | 0.05 g |
| n-Propyl acetate | 84 g |
| Cyclohexanone | 42 g |

EXAMPLE 2

Preparation of Light-Sensitive Transfer Sheet (2)

Four kinds of colored sheets, each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine used in said coating solution for forming the peeling layer was replaced by diethanolamine (pKa=8.88). The thus prepared sheets were named light-sensitive transfer sheet (2).

EXAMPLE 3

Preparation of Light-Sensitive Transfer Sheet (3)

Four kinds of colored sheets, each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine used in said coating solution for forming the peeling layer was replaced by 2-aminoethanol (pKa=9.50). The thus prepared sheets were named light-sensitive transfer sheet (3).

EXAMPLE 4

Preparation of Light-Sensitive Transfer Sheet (4)

Four kinds of colored sheets, each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine used in said coating solution for forming the peeling layer was replaced by ethylamine (pKa=10.6). The thus prepared sheets were named light-sensitive transfer sheet (4).

EXAMPLE 5

Preparation of Light-Sensitive Transfer Sheet (5)

Four kinds of colored sheets, each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine used in said coating solution for forming the peeling layer was replaced by diethylamine (pKa=10.9). The thus prepared sheets were named light-sensitive transfer sheet (5).

EXAMPLE 6

Preparation of Light-Sensitive Transfer Sheet (6)

Four kinds of colored sheets, each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine used in said coating solution for forming the peeling layer was replaced by triethylamine (pKa=10.8). The thus prepared sheets were named light-sensitive transfer sheet (6).

EXAMPLE 7

Preparation of Light-Sensitive Transfer Sheet (7)

Four kinds of colored sheets, each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine used in said coating solution for forming the peeling layer was replaced by a triethanolamine-ethylene glycol mixture of the same weight (mixing ratio=1:1 by weight). The thus prepared sheets were named light-sensitive transfer sheet (7).

COMPARATIVE EXAMPLE 1

Preparation of Light-Sensitive Transfer Sheet (8)

Four kinds of colored sheets, each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine was removed from said coating solution for forming the peeling layer. The thus prepared sheets were named light-sensitive transfer sheet (8).

COMPARATIVE EXAMPLE 2

Preparation of Light-Sensitive Transfer Sheet (9)

Four kinds of colored sheets, each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine used in said coating solution for forming the peeling layer was replaced by lactic acid (pKa=3.86). The thus prepared sheets were named light-sensitive transfer sheet (9).

COMPARATIVE EXAMPLE 3

Preparation of Light-Sensitive Transfer Sheet (10)

Four kinds of colored sheets, which each comprised of a temporary support coated with in order, a peeling layer (undercoat layer) comprising an alcohol-soluble polyamide and an alcohol-insoluble interlayer, a color material layer and a light-sensitive resin layer, were prepared in the same manner as in Example 1, except that triethanolamine used in said coating solution for forming the peeling layer was replaced by aniline (pKa=4.60). The thus prepared sheets were named light-sensitive transfer sheet (10).

Evaluation of Light-Sensitive Transfer Sheets

The thus prepared light-sensitive transfer sheets (1) to (10), which each consisted of four sheets colored differently, underwent the following examinations in transferred-image characteristics (pattern evaluation) using an image-receiving sheet prepared in the manner described later.

The light-sensitive transfer sheets were allowed to stand for 3 days under an atmosphere of 45° C. and 75% relative humidity (RH). Thereafter, four constituent colored sheets of each light-sensitive transfer sheet were exposed imagewise for 60 seconds to a high pressure mercury lamp of 1 kW, P-670FW (trade name, produced by Dainippon Screen Mfg. Co., Ltd.) through the corresponding color separation masks, respectively, and then developed automatically at 31° C. for 34 seconds with a 5-fold diluted solution of color arts developer, CA-1 (trade name, products of Fuji Photo Film Co., Ltd.) wherein a color arts processer (CA-600P, trade name, made by Fuji Photo Film Co., Ltd.) was used. Four color-proofing sheets which had reproduced faithfully the corresponding color separation masks in the above-described manner were transferred onto an image-receiving sheet. More specifically, the color-proofing sheet of black color was firstly superposed upon the image-receiving sheet so that the image side of the color-proofing sheet might be brought into contact with a photopolymerized image-receiving layer of the image-receiving sheet, and then they were laminated using a laminator (Fast laminator 8B-550-80, trade name, produced by Taisei Shoji Co., Ltd.) under a condition that the pressure was 2 bar, the roller temperature was 110° C. and the laminator speed was 60 cm/min. The support alone in the color-proofing sheet was peeled apart therefrom to conclude the transfer of the black image on the image-receiving sheet. Successively, the three color-proofing sheets remaining were subjected to the same processings as described above. Thus, an image-received sheet in which black, cyan, magenta and yellow images had been transferred, in that order, was obtained.

The light-sensitive transfer sheets prepared in the foregoing examples were graded A to D in pattern evaluation in accordance with the following criteria.

A: When four color-proofing sheets of different colors were transferred in series onto the image-receiving sheet, their individual peeling facility and thermal adhesiveness were both on a high level, and the images obtained on the image-receiving sheet were also of high quality.

B: A light-sensitive transfer sheet constituted by four different color-proofing sheets was somewhat inferior to those graded A, but on a practically serviceable level.

C: When four color-proofing sheets of different colors were transferred in series onto the image-receiving sheet, neither their individual peeling facility nor thermal adhesiveness was on a fully satisfactory level.

D: A light-sensitive transfer sheet constituted by four different color-proofing sheets was still more insufficient in peeling facility and poor in thermal adhesiveness, compared with those graded C, that is, on a level insufficient for practical use.

Preparation of Image-Receiving Sheet

The image-receiving sheet employed in the pattern evaluation was prepared in the following manner.

A coating solution having the following composition was prepared, coated uniformly on a polyethylene terephthalate film (100 μm in thickness) and dried to provide a photopolymerized image-receiving layer having a dry thickness of 20 μm. Thus, an image-receiving sheet constituted by the support and the photopolymerized image-receiving layer was obtained.

| Coating Composition for Photopolymerized Image Receiving Layer: | |
|---|---|
| Methylmethacrylate polymer (mean molecular weight: 100,000) | 85 g |
| Vinyl chloride/vinyl acetate/vinyl alcohol copolymer (S-LEC A, trade name, produced by Sekisui Chemical Co. Ltd.) | 8 g |
| Benzoin methyl ether | 5 g |
| Paramethoxyphenol | 0.09 g |
| Trimethylolpropane trimethacrylate | 60 g |
| Methyl ethyl ketone | 300 g |

TABLE 1

| | Image transfer property | | |
|---|---|---|---|
| | Fresh | Storage for 45° C. and 75% RH for 3 days | pKa value of Basic Compound |
| Example 1 | A | A | 7.76 |
| Example 2 | A | A | 8.88 |
| Example 3 | A | A | 9.50 |
| Example 4 | A | A | 10.6 |
| Example 5 | A | A | 10.9 |
| Example 6 | A | A | 10.8 |

TABLE 1-continued

| | Image transfer property | | pKa value of Basic Compound |
|---|---|---|---|
| | Fresh | Storage for 45° C. and 75% RH for 3 days | |
| Example 7 | A | A | 7.76 |
| Comparative Example 1 | A | B | — |
| Comparative Example 2 | B | D | 3.86 |
| Comparative Example 3 | B | C | 4.60 |

These results definitely show that the color-proofing sheets prepared using the basic compounds of a high pKa value, in accordance with this invention (Examples 1 to 7), did not undergo deterioration by lapse of time (or storage for 3 days at 45° C. and 75% relative humidity (RH)). the photopolymerized images formed therein were transferred in a satisfactory condition to provide transferred images of good quality.

In contrast with the results of this invention, the color-proofing sheets prepared without adding basic compound (Comparative Example 1) or those prepared using acidic compounds of a low pKa value (Comparative Examples 2 and 3) suffered deterioration over of time in their individual peeling layers to result in poor transfer of the photopolymerized images formed therein onto the image-receiving sheet, that is, lowering of transferred image quality.

While the invention has been described in detail and with reference to specific examples thereof, it will be apparent to one skilled in the art that various changes and modifications can be made therein without departing from the spirit and scope thereof.

What is claimed is:

1. A light-sensitive transfer sheet, which comprises a support having provided thereon a peeling layer comprising an alcohol-soluble polyamide, an alkali-soluble organic polymer and a basic compound with an acid dissociation constant of at least 7, and a color material-incorporated light-sensitive resin layer or a color material layer and a light-sensitive resin layer, in that order.

2. The light-sensitive transfer sheet of claim 1, wherein said basic compound is represented by the following formula (I):

$$R^1-N-R^3 \atop |\atop R^2 \qquad (I)$$

wherein $R^1$, $R^2$ and $R^3$ may be the same or different, each representing a 2-hydroxyethyl group, a hydrogen atom, a halogen atom, an alkyl group, an aralkyl group, an aryl group, an alkenyl group, an alkinyl group or a hydroxyl group.

3. The light-sensitive transfer sheet of claim 3, wherein said basic compound is an aliphatic amine compound.

4. The light-sensitive transfer sheet of claim 3, wherein said basic compound is at least one compound selected from the group consisting of diethanolamine, triethanolamine and diethylamine.

5. The light-sensitive transfer sheet of any one of claims 1, 2, 3 or 4, wherein the content of said basic compound in the peeling layer is from 0.001 to 10% by weight.

6. The light-sensitive transfer sheet of claim 1 wherein said support is composed of polyethylene terephthalate, polycarbonate or a heat-treatment product thereof.

7. The light-sensitive transfer sheet of claim 6 wherein said support is provided with a backing layer applied to the side of said support opposite the side to which said peeling layer is applied.

8. The light-sensitive transfer sheet of claim 1 wherein said light-sensitive resin is an alkali-developable light-sensitive resin.

9. The light-sensitive transfer sheet of claim 8 wherein said light-sensitive resin layer is a negative-positive light-sensitive resin layer.

10. The light-sensitive transfer sheet of claim 8 wherein said light-sensitive resin layer or color material incorporated light-sensitive resin layer is a positive-positive light-sensitive resin layer.

* * * * *